(12) United States Patent
Svensson

(10) Patent No.: US 6,773,509 B1
(45) Date of Patent: Aug. 10, 2004

(54) MOLECULAR BEAM EPITAXY SYSTEM AND METHOD

(75) Inventor: Stefan P. Svensson, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 59 days.

(21) Appl. No.: 10/345,966

(22) Filed: Jan. 17, 2003

(51) Int. Cl.[7] .............................................. C30B 35/00
(52) U.S. Cl. ........................ 117/105; 117/84; 117/89; 117/104
(58) Field of Search .......................... 117/84, 89, 104, 117/105

(56) References Cited

U.S. PATENT DOCUMENTS 5,156,815 A  * 10/1992  Streetman et al. .......... 422/129

* cited by examiner

*Primary Examiner*—Felisa Hiteshew
(74) *Attorney, Agent, or Firm*—Edward L. Stolarum

(57) ABSTRACT

An improved molecular beam epitaxy (MBE) system and method in which an interface and a processing component associated with the MBE system enables an operator to set up the molecular beam epitaxy system such that it will produce beam fluxes of the correct magnitude and with a high degree of precision in response to inputted growth criteria. In standard operation mode, after user input of desired growth parameters, a command file is started via interaction through the interface.

28 Claims, 7 Drawing Sheets

Preparation for Start

| | | | |
|---|---|---|---|
| 238 — Est.Cal time | 0 | Hr | 40 Min |
| 240 — Start Time | 6 | : | 30 Min |
| 242 — Est. Finish Time | 7 | Hr | 10 Min |

224 →

| | | |
|---|---|---|
| 226 — Pressure test | 2.0E-9 | Torr |
| 228 — Cell up ramp | 30 | Min |
| 230 — Outgas % | 2.50 | % |
| 232 — Outgas time | 10 | Min |
| 234 — Cell transient | 150 | Sec |
| 236 — Stab time | 150 | Sec |

244 — Create Calib.cmd
246 — Check Calib.cmd
Return

| 102 Order | 104 Elements | 206 Ramp | 208 Temp | 210 Max Temp | 212 Min Temp | 214 Cal | 216 Flux Targets | 218 Precision | 220 Slope | 222 Interc flux |
|---|---|---|---|---|---|---|---|---|---|---|
| 1. | Ga | ☐ | 756.0 | 900.0 | 100.0 | ☐ | 1.914E-8 | 0.0250 | -10000.0 | 2.000 |
| 2. | Al | ☐ | 0.0 | 1100.0 | 820.0 | ☐ | 0.000E+0 | 0.0250 | -10000.0 | 2.000 |
| 3. | In | ☐ | 0.0 | 800.0 | 100.0 | ☐ | 0.000E+0 | 0.0250 | -9574.6 | 1.976 |
| 4. | Tl | ☐ | 0.0 | 600.0 | 100.0 | ☐ | 0.000E+0 | 0.0250 | -10000.0 | 2.000 |
| 5. | Si | ☐ | -273.0 | 1350.0 | 100.0 | ☐ | | 0.0250 | -10000.0 | 2.000 |
| 6. | Be | ☐ | -273.0 | 800.0 | 100.0 | ☐ | | 0.0250 | -10000.0 | 2.000 |
| 7. | As | ☐ | 0.0 | 400.0 | 10.0 | ☐ | 0.000E+0 | 0.0250 | -10000.0 | 2.000 |
| 8. | Sb | ☐ | 0.0 | 500.0 | 10.0 | ☐ | 0.000E+0 | 0.0250 | -10000.0 | 2.000 |

FIG. 4

Absoulte Calibration

Enter values — 410

| Elements 104 | Growt Rate 416 | Flux (Torr) 418 | Temp (C) 420 | Slope |
|---|---|---|---|---|
| Ga | 3.0000E+0 | 2.300E+0 | 886.0 | -10000.0 |
| Al | 1.0170E+0 | 1.000E-8 | 1000.0 | -10000.0 |
| In | 1.0000E+0 | 1.000E-7 | 600.0 | -9574.6 |
| Tl | 1.0170E+0 | 1.000E-6 | 500.0 | -10000.0 |
| Si | 1.0000E+18 | 1.000E+0 | 1111.0 | -10000.0 |
| Be | 1.0000E+18 | 1.000E+0 | 800.0 | -10000.0 |
| As | 1.0000E+0 | 1.000E-5 | 375.0 | -10000.0 |
| Sb | 1.0000E+0 | 1.000E-5 | 500.0 | -10000.0 |

Results — 412

| Flux Interc 424 | Rate Interc 426 | Update 422 |
|---|---|---|
| 8.990 | 9.105 | |
| -0.145 | 7.863 | |
| 3.967 | 10.967 | |
| 6.937 | 12.944 | |
| 7.225 | 25.225 | |
| 9.320 | 27.320 | |
| 10.432 | 15.432 | |
| 7.937 | 12.937 | |

Done 428    RHEED 430

ARL MBE Calibration Setup

Current Growth System: ardennes

Mole calc: Inp — 610

Menu — 134
- Abs calib
- Prep for Start
- Config file
- Flux lines
- Help
- Quit

| Order | Elements | Group | Include | Mole fraction | Growth Rate /Doping | Flux (Torr) | Temp (C) | Slope | Flux Interc | Ratio GR/[F*T^n] |
|---|---|---|---|---|---|---|---|---|---|---|
| 1. | Ga | 0 | ✓ | 1.0000 | 4.1839E-1 | 8.009E-8 | 717.4 | -10000.0 | 2.000 | 6.656E+4 |
| 2. | Al | 3 | ✓ | 0.3000 | 4.3295E-1 | 8.288E-8 | 520.5 | -8000.0 | 2.000 | 1.248E+5 |
| 3. | In | 3 | ✓ | 0.1000 | 4.7541E-1 | 2.281E-7 | 539.3 | -7000.0 | 1.976 | 4.529E+4 |
| 4. | Tl | 3 | | 0.2000 | 0.0000E+0 | 0.000E+0 | 0.0 | -7500.0 | 2.000 | 3.658E+4 |
| 5. | Si | 4 | ✓ | | 0.0000E+0 | 0.000E+0 | -273.0 | -10000.0 | 7.225 | 2.688E-2 |
| 6. | Be | 3 | ✓ | 0.0000 | 0.0000E+0 | 0.000E+0 | -273.0 | -10000.0 | 9.320 | 3.053E+16 |
| 7. | As | 5 | ✓ | | 0.0000E+0 | 0.000E+0 | 0.0 | 7.8 | 2.000 | 3.928E+3 |
| 8. | Sb | 5 | | 1.0000 | 0.0000E+0 | 0.000E+0 | 0.0 | 7.3 | 2.000 | 3.597E+3 |

Master Growth Rate: 0.4184    Total Group 3 flux: Group 0 = master growth rate    2.444E-7

InGaAs GR: 1.0000  um/hr on InP
AlInAs GR: 1.0163  um/hr on InP

| x | $[a_x/a_{GaAs}]^3$ | $[a_{GaAs}/a_x]^3$ |
|---|---|---|
| InSb | 1.5056 | 0.6642 |
| GaSb | 1.2538 | 0.7976 |
| InAs | 1.2308 | 0.8125 |
| InP | 1.1188 | 0.8938 |
| AlAs | 1.0039 | 0.9962 |

*FIG. 6*

MOLECULAR BEAM EPITAXY SYSTEM AND METHOD

STATEMENT OF GOVERNMENT INTEREST

The invention described herein may be used and/or licensed by or for the Government of the United States of America.

BACKGROUND OF THE INVENTION

1. Field of the Invention

This invention relates generally to molecular beam epitaxy (MBE) systems and methods of operation.

2. Discussion of The Related Art

MBE machines are mostly started using a mix of computer program tools and manual decisions and actions. The goal of the start up process is to warm up a certain number of evaporation cells from an idling temperature to a higher operating temperature at which they produce flux levels that in turn produce a certain growth rate of a crystal when allowed to impinge on a substrate. Before such a warm-up is started, it is highly desirable to know the pressure in the MBE vacuum system so that the process can be aborted if the pressure is too high.

The target fluxes are usually calculated using proprietary software written in an arbitrary computer language or set up as a spreadsheet. The algorithm in such software is trivial and commonly known. It is assumed that the logarithm of the beam flux is linearly dependent on the inverse of the absolute temperature of the cell times the square root of the temperature. The linear relationship is determined occasionally in situ by beam flux measurements at a set of temperatures. Furthermore, it is assumed that the growth rate is directly proportional to the flux. The latter proportionality is determined experimentally, either using reflection high-energy electron diffraction (RHEED) oscillations or by growth of one or more test structures using carefully measured fluxes at specific temperatures and for specific times with subsequent ex-situ measurement of thickness and/or compositions to determine the resulting growth rates.

Dopant fluxes are too small to be measured directly using a beam gauge. They are therefore usually calibrated by growth of one sample with several layers using different doping cell temperatures, or by growth of several samples at different temperatures. In the first case the sample can be evaluated using electro-chemical capacitance-voltage profiling and in the second case also by Hall effect measurements. Once measured, a linear relationship between the logarithm of the doping concentration and the inverse absolute temperature is determined and normalized to a specific growth rate of the matrix material. Using this relationship, the dopant cell temperature that produces an arbitrary dopant level at an arbitrary growth rate can be calculated.

Commonly the operating temperatures calculated in this way are entered in a control computer, which can ramp the cell set points from an idling level to the desired targets. This process takes at least ½ hr and is preferably done before work hours. In other words, the computer program is started during the previous workday and set up to start a certain period of time before the operator is expected to arrive at work. However, if no provision is made to check the vacuum integrity of the system before this process is started, a certain risk exists that the ramping will damage the system. Some operators write custom software to perform this check while others simply chose to accept the risk.

Once the cell temperatures have reached their target values (typically after a brief overshoot to provide cleaning) the fluxes must be measured again. The reason is that some hysteresis may be characteristic of the behavior of the cells and that evaporants have been consumed in various amounts since the last measurement. Thus, the calculated temperature will usually not produce the desired flux with acceptable accuracy. The temperatures must then be adjusted iteratively based on measured values. This process can be very time consuming and must follow a rigid protocol to ensure that reproducible numbers are obtained.

BRIEF DESCRIPTION OF THE DRAWINGS

FIG. 1 is illustrative of a main screen provided through an interface device of the MBE system in which user information pertaining to selected elements and growth rates is inputted.

FIG. 2 is illustrative of a preparation for start screen which allows information pertaining to calibration times and ramping temperatures of cells to be inputted prior to operation of the molecular beam epitaxy system.

FIG. 2.

FIG. 4 is illustrative of an absolute calibration screen in which prompted information is provided in response to a change in the relationship between flux and growth rate.

FIG. 6 is a modified version of FIG. 1 and is illustrative of a screen for input of information pertaining to selected elements and growth rates using InP as a substrate.

DETAILED DESCRIPTION

Figure 3:
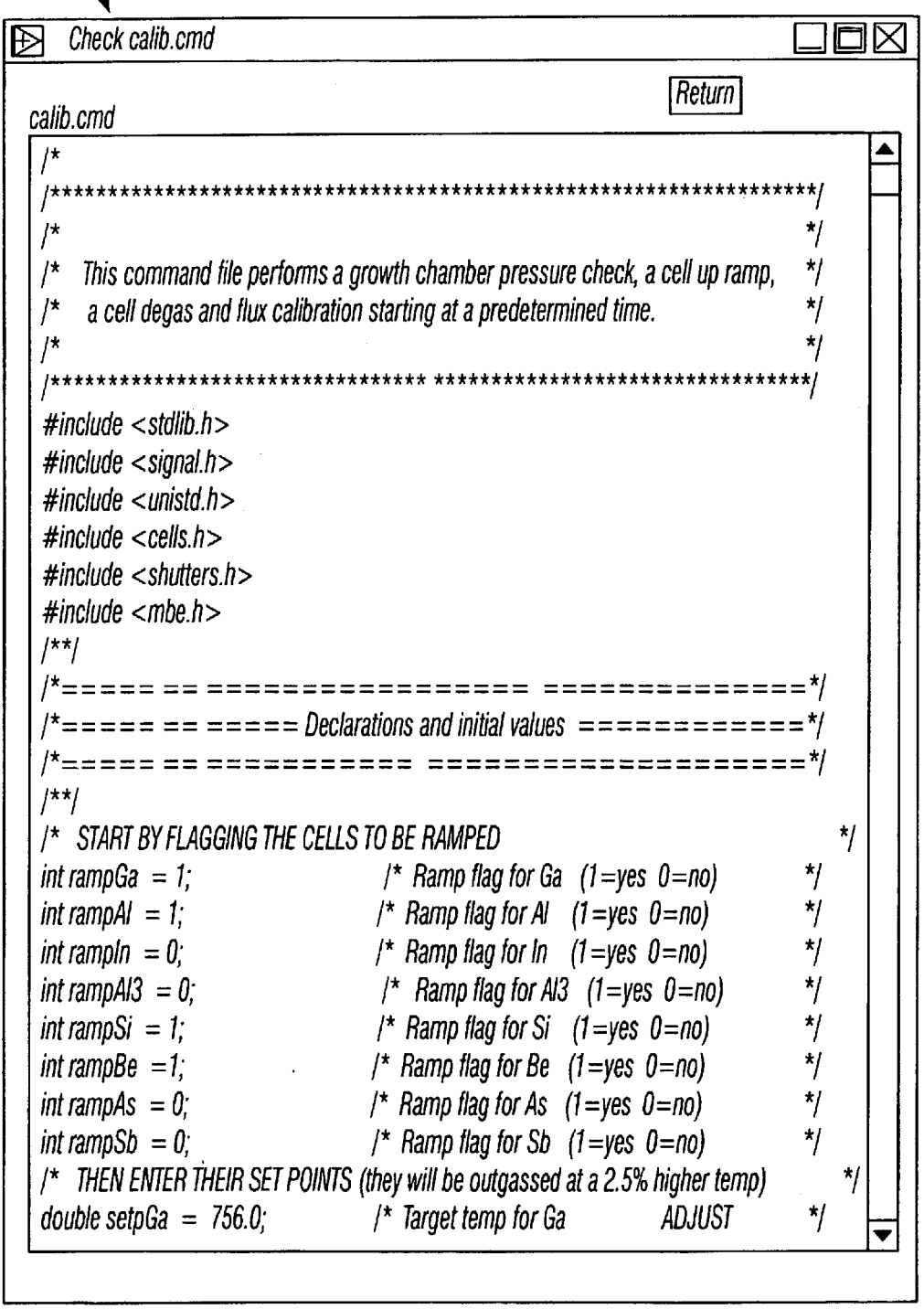
FIG. 3 is illustrative of a check calibration command screen displaying the listing of a command file created by entering information from FIG. 1.

As will be shown and described herein, an improved molecular beam epitaxy (MBE) system and method of operation is provided in which the MBE system has an associated interface device adapted to receive inputted growth criteria. The MBE system is automatically allowed to produce beam flux in response to the inputted growth criteria. The MBE system is a computer controlled system having one or more processing components which perform calculations based on user information received via the interface to produce appropriate beam fluxes.

An operator of the MBE system is enabled to set up the system in such a way that it will produce beam fluxes of an appropriate magnitude and with a high degree of precision, based on desired growth rates and mole fractions. In one example, the information is inputted using the interface (such as a software generated Windows based interface) in which various prompts are provided to the user (or operator) to enter needed information. In standard operation mode, upon input of desired growth parameters a command file is started using a terminal window of the interface. The software based MBE system allows the user to enter desired growth rates and doping levels and the system is able to perform a vacuum integrity check before temperature ramps are started. The system is allowed to perform interactive flux measurements and temperature adjustments until a predetermined accuracy is obtained.

The software based MBE system utilized may selectively be an Applied Epi "Molly" brand MBE control system manufactured by Applied Epi, Inc. of St. Paul, Minn. The Molly brand MBE system controls the process with commands from a script language. Writing scripts requires skill and ample time for testing, which may not be available to the typical MBE operator. To overcome this problem, the software based MBE system having a processing component and interface device such as a graphical user interface is employed to capture the intents of the operator and to automatically translate this to a script, which subsequently is executed. The improved MBE system creates a command file, which in one example is selectively started and executed by the "Molly" MBE system control software of Applied Epi. The examples provided herein are illustrative of a III-V MBE system, i.e., a system configured only with materials from the 3rd and 5th column of the periodic table. Other configurations are also able to be made using the same concepts.

Figure 1:
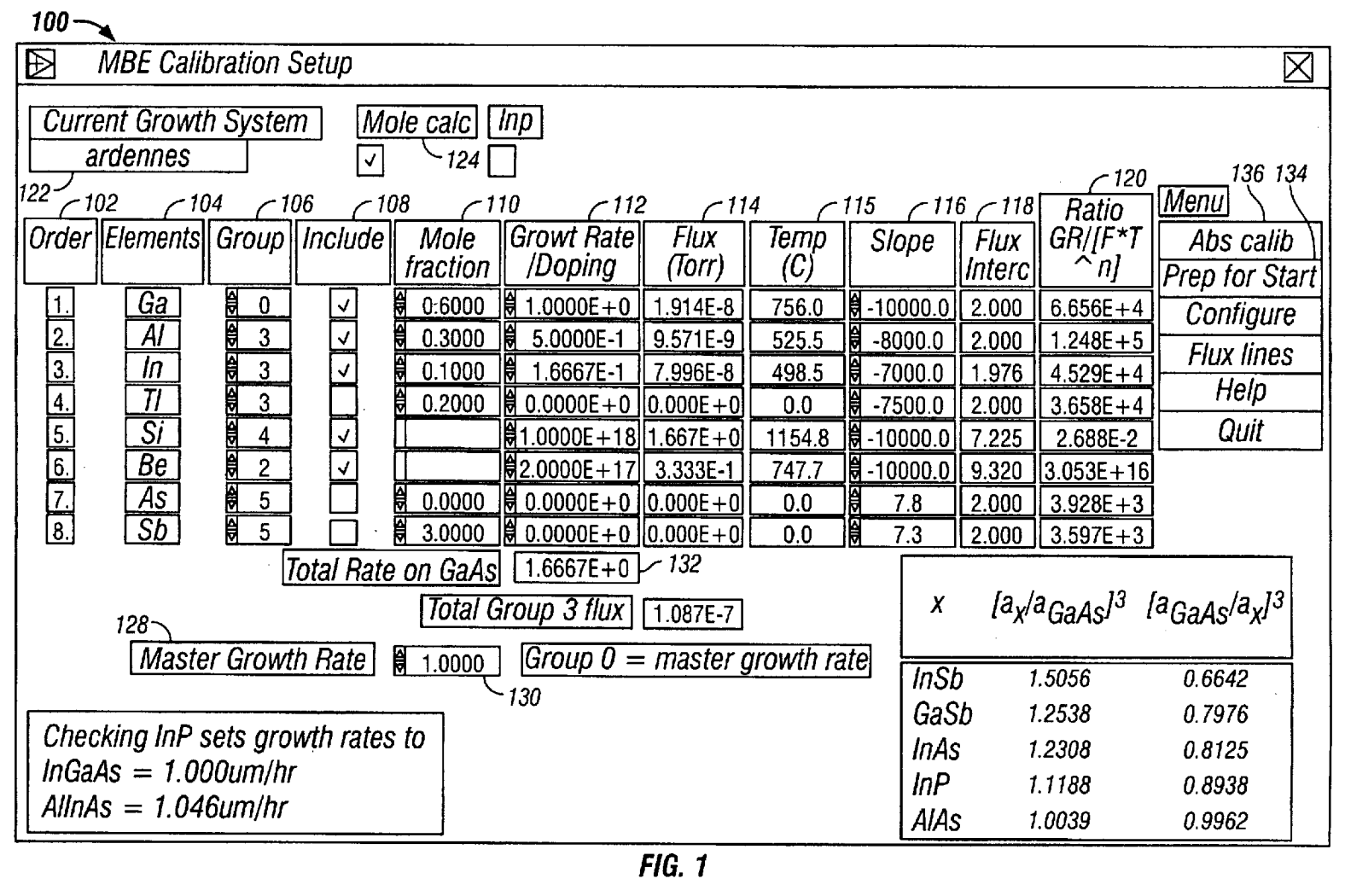

Referring now to FIG. 1, an illustration of the main screen 100 provided through a graphical user interface in operation with the software controlled processing component of the MBE system is provided. As seen in FIG. 1, a number of input prompts are provided to permit selected information, including information pertaining to various elements and growth rates to be inputted for processing at the MBE system.

A first column named Order 102 identifies a number for the materials which represents the order in which the flux calibrations will take place. The second column named Elements 104 contains the chemical abbreviation of the elements. The third column named Group 106 contains the number of the column (or group) of the periodic table from which the element originates. One exception is that the element denoted a master element is given the number 0 for group. The next column named Include 108 contains check marks to denote if the element is to be included in calculations for compounds. The following column contains the mole fraction 110. (This entry is generally not available for elements from group 2 and 4, which are dopants). After this follows the column that contains the growth rate 112, or in the case of dopants, the doping level. The main calibration set up screen 100 provides input for the corresponding flux levels identified as Flux 114 in Torr and cell temperatures identified as Temp 115 in degrees centigrade. As seen in FIG. 1, the MBE calibration start up screen appearing through the interface device is adapted to permit selected elements to be inputted to the MBE system as well as selective growth rates and doping levels associated with the selected elements.

Separated from the other data, on the right side of the calibration set up screen 100, are three more columns that list the slope, K, 116 and the intercepts for the flux, M, 118 Column 120 lists a factor. A, describing the empirically determined relationship between flux F, and growth rate, GR, as follows:

$$GR = A\ F(T)^n$$

$$F = 10^{K/T+M}$$

The exponent, n, is expected to be equal to ½, but can be set to an arbitrary value if the empirically determined system behavior calls for it. The MBE system configuration, i.e., the set of elements and their slope characteristics are able to be saved in a memory file. The configuration may selectively use an MBE machine name as a label 122, which is displayed in this case ardennes.

In the example seen in FIG. 1, a box prompt labeled Mole calc 124 is checked. This uses data taken from growths and calibrations on GaAs substrates (in this example) as the basis for the calculations. Alternatively, a box prompt named can be checked, which sets the growth rates to a specific combination suitable for growth on that substrate which will be further described below.

The software controlled processing component of the MBE system is adapted to perform calculations of mole fractions in relation to the input of a selected compound and the input of a master material. A compound to be grown and a master material are selected and mole fractions are calculated in relation to the master material to determine the growth of the compound. In particular when, Mole calc prompt 124 is checked the MBE system uses the material marked "Master" as the element in a compound which the other mole fractions are measured in relation to. The growth rate of the Master material 128 is set to a specific value 130 in the prompt box as seen at the bottom of the screen 100 in FIG. 1, in this case, 1 micron/hr. If one or more other group 3 elements are checked, they will be included as part of a compound. The mole fractions of those elements are entered, the sum of which preferably is less than 1. The mole fraction of the master element is automatically calculated as one minus the sum of the other group 3 elements. The MBE system is adapted to perform calculation of set-up point and target fluxes. For a given combination of mole fractions, the growth rates of all the group 3 elements are calculated and summed in a window 132 below the individual growth rates. The fluxes 114 and temperatures 115 are calculated using the individual growth rates 112 and the linear relationship data.

When the MBE system is selectively set up for growth of several compounds, each growth rate for the appropriate group 3 elements are able to be determined sequentially by first checking them as included and then unchecking them. As an example, consider the system to be set up for growth of AlGaAs and InGaAs. The Ga and Al are first checked and the Al mole fraction adjusted. This produces an appropriate temperature and flux for Al. Then Al is unchecked and In checked. While the In mole fraction is adjusted no changes appear in the temperature and flux associated with Al since it is not included in the calculation. However, a new temperature and flux will be calculated for In. Similarly, if target temperatures are to be calculated for the dopants the appropriate elements for the compound and the desired dopant need to be checked. The dopant level is entered in the growth rate/dopant column 112 and a temperature set point will be calculated. Once all set points and fluxes are calculated, the operator actuates the input prompt prep for start 134. This initiates processing to open up a new window (preparation for start screen 200) as seen in FIG. 2.

As seen in FIG. 2, a preparation for start set-up screen 200 associated with the graphical user interface is provided which is adapted to receive inputted information to allow for calibrations of temperature cells prior to the operation of the MBE system. FIG. 2 may be regarded as continuation of FIG. 1. Two window screens are shown herein for compactness and ease of reading. The first two columns 102 and 104 in the example of FIG. 2 are the same as in FIG. 1. The column having input prompt labeled Ramp 206 provides a warm up temperature for the elements and denotes if the element should be warmed up from idling temperature to Temp 208 seen in the next column. These are the same temperatures that were calculated in FIG. 1. The next two columns (Max temp 210 and Min Temp 212) are the extreme temperatures that are allowed for the system in this example. During the flux calibration the software program controlled processor of the system will not set temperatures outside these extreme values even if required to reach a certain target flux. The extreme temperatures 210 and 212 are parameters that are part of the system configuration.

The next column having input prompt marked Cal 214 denotes if a flux calibration should be done on that cell. If checked, the software based processing component will use the flux values calibrated earlier as targets which are shown in the column marked Flux Targets 216. Column labeled Precision 218 contains information on the desired accuracy of the flux calibration. The procedure of measuring and adjusting the fluxes is considered done when the absolute value of the target value minus the measured value divided by the target value is less than the value in the precision column 218. Columns labeled slope 220 and intercept flux 222 contain the information on the linear relationship between flux and temperature, which are repeated from FIG. 1.

At the top of the screen is a box 224 that contains information on specific details related to the ramp and calibration process. The first parameter Pressure test 226 is the pressure of the MBE system that is read if ramping will be started. In other words, the pressure must be lower than Pressure Test indicates. The parameter cell up ramp 228 is the time it will take to ramp from idling to the set point multiplied by Outgas % 230. That is, the cells will initially not just be ramped to the set point but to a slightly higher value to accomplish outgassing of impurities. The temperatures will be held at that elevated level for a period given by Outgas time 232. After this, the temperatures are ramped down to the target set points. At that time flux measurements are started. For each cell included in the calibration sequence, the shutter is opened while a beam gauge is kept facing away from the cell.

A waiting period of length equal to Cell transient 234 then takes place. Next the gauge is turned toward the cell and readings with the shutter open and closed are recorded. The difference between the latter two is stored as the beam flux value. If the determined beam flux deviates from the target beam flux by more than the accuracy parameter, an adjustment to the temperature is made using the linear relationship between the logarithm of the flux and the inverse absolute temperature. Each cell is allowed to stabilize for a period of time given by the parameter Stab time 236 before the next measurement is made. As can be seen in FIG. 2 information is provided at the set-up screen of the interface which relates to: the order in which flux calibrations are to take place; the name of an element to be used; a warm up temperature for each of the elements selected; a temperature range allowed for the MBE system; an indication that flux calibration is to be done on a temperature cell; flux targets; a proposed accuracy of the flux calibration; a time needed to ramp from an idling temperature to a selected set-point; a temperature in which impurities are to be outgassed; the length of time the system will be held at an outgassed temperature; the length of time for cells to be calibrated; and the length of time cells are to stabilize. An estimate of the length of the whole procedure 238 is calculated which based on the start time 240 used to estimate the time when the process will be finished 242. Thus, the start time can be adjusted so that the process finishes at a suitable time, e.g. at the beginning of the workday.

Once all adjustments have been made, the operator actuates a command file identifier button labeled Create Calib.cmd 244. This automatically creates a command file with a name such as "Calib.cmd". This file is able to be inspected by actuating the button Check Calib.cmd 246, which produces a listing of the file through the graphical user interface on a check calibration command screen 300 such as seen in FIG. 3. If the process has been successful, the only thing that remains is to open a terminal window under the software based MBE system (such as a "Molly" brand MBE system) and run the file "Calib.cmd". The other procedures are performed automatically.

The MBE system may selectively perform iterative flux measurements and temperature adjustments until a predetermined accuracy is achieved. A change in relationship between a flux rate and growth rate may be identified during operation of the MBE system. Under typical operating conditions the automated flux calibration process will converge even if the slope of the flux-temperature line has some error. However, in order to achieve the most rapid convergence it is preferable to let the software based MBE system use the most accurate slope information. Similarly, it is useful to update the intercept of the flux line to provide the fastest convergence.

If the relationship between the flux and the growth rate has changed, this information is provided to the software based processing component, otherwise incorrect growth rates will be produced. Desired growth levels are obtained in response to the change in relationship between the flux rate and the growth rate. When the operator actuates a button marked Abs Calib 136 in FIG. 1, a new window is opened as shown in FIG. 4.

As seen in the absolute calibration screen 400 at the graphical user interface of FIG. 4 the elements 104 are listed in the first column. Two other sets of columns are shown labeled "Enter values" 410 and "Results" 412. The Enter values set 410 allows entry of the absolute growth rate 416, the flux in Torr 418, and the cell temperature in C.° 420. In order to allow experimentation with the entries, the new intercepts are not updated until the input prompt box labeled Update 422 is checked. When the new data has been entered and new intercepts calculated (flux intercept 424 and Rate intercept 426), this information is carried back to the screen in FIG. 1 once the button labeled "Done" 428 in FIG. 4 is actuated.

Figure 5:
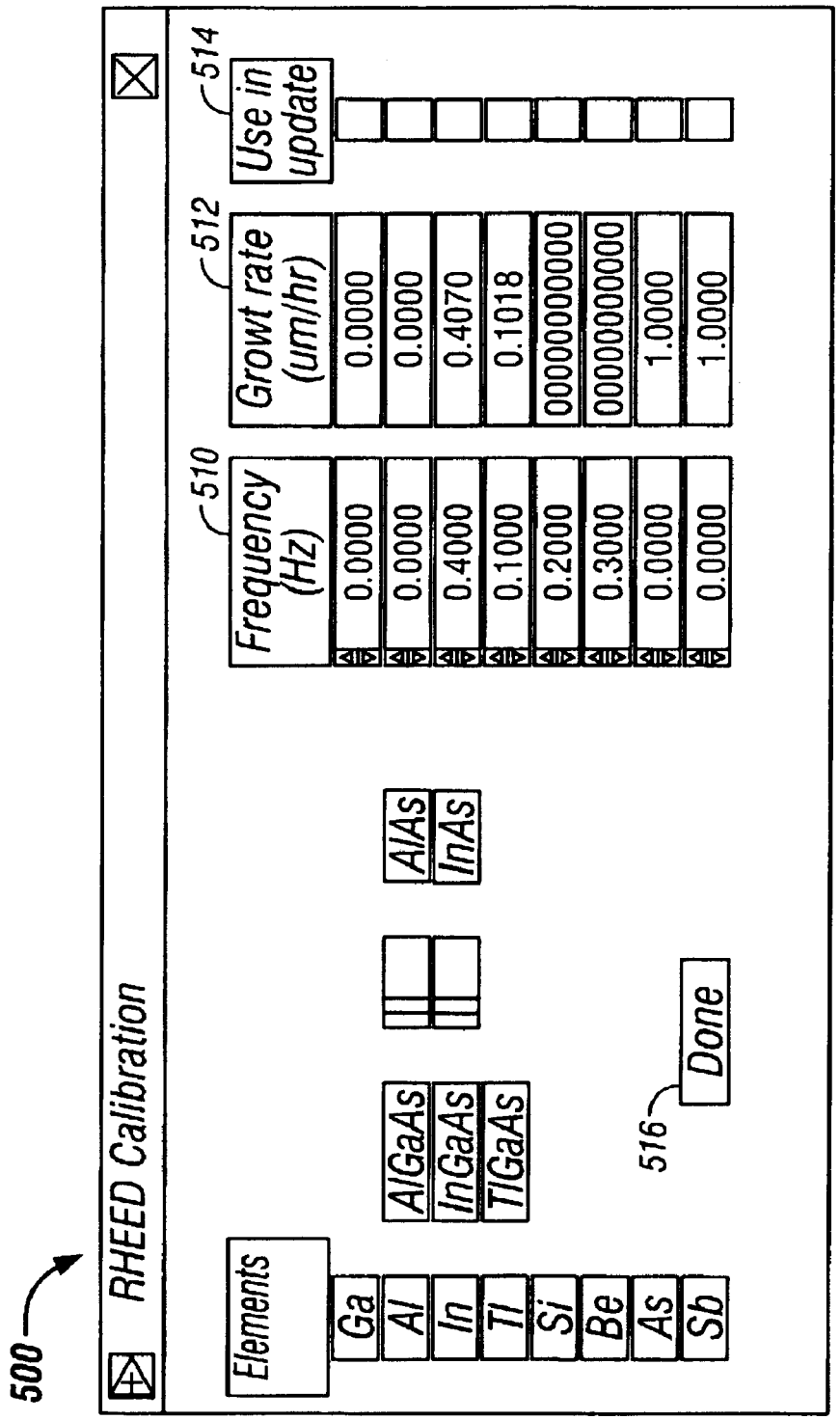
FIG. 5 is illustrative of a RHEED calibration screen for entry of information based on observation of RHEED oscillations to perform in-situ calibrations of certain elements.

The improved MBE system is able to perform in-situ calibration through observation of the intensity from reflection high-energy election diffraction (RHEED) oscillations selective through the interface. In-situ calibration of some elements by observing oscillations in the intensity from reflection high-energy electron diffraction (RHEED) patterns is performed by providing information relating to the elements selected, substrate, frequency of oscillations and growth rate. This requires a light detector and analysis system that can determine the frequency of the oscillations, which correspond to the growth rate of one atomic layer per period. By actuating on the button labeled "RHEED" 430 in FIG. 4 another window (the RHEED calibration screen 500) is opened up as shown in FIG. 5. This provides a calculator that allows input of the frequency 510 in Hz and direct translation into growth rate 512 in micron per hour. This calculator can be used either to determine growth rates from binaries like GaAs, AlAs and InAs, or from ternaries like AlGaAs or InGaAs, using GaAs as a base frequency. In the latter case the GaAs frequency is subtracted from the frequency of the ternary to produce the net growth rate of the other group 3 element. If boxes labeled "Use in update" 514 are checked the new growth rates are carried back to the screen shown in FIG. 4 once the button labeled "Done" 516 is clicked in FIG. 5.

InP mode and growth on substrates other than GaAs may be achieved. The previous examples have assumed that the substrate is GaAs. GaAs and AlAs to a very good approximation lattice match to that substrate irrespective of the relative growth rates. InGaAs can be grown pseudomorphically on GaAs, i.e. a layer thin enough that dislocations do not form can be deposited. Growth rates may selectively be calculated based on different identified substrates. On other substrates like InP, InAs, and GaSb care must be taken to assure lattice match. Assuming a GaAs-based operation, all growth rates will be known on a GaAs substrate. Since other substrates have larger lattice constants the growth rates for a given element will increase by the third power of the lattice constant ratio. (See the table in lower right-hand corner of FIG. 1). For example, on InP the rate will increase by a factor of 1.1188 compared to GaAs. The compositions of $In_xGa_{1-x}As$ and $In_yAl_{1-y}As$ that lattice match to InP are x=0.53190 and y=0.52337. By setting the growth rate of InGaAs on InP to 1 micron/hr the equivalent growth rate on GaAs would be 1/1.1188=0.8938 micron/hr. The equivalent growth rates for InAs=0.4754, GaAs=0.4184 and AlAs=0.4594 can then be calculated.

These relationships are programmed in to the software of the MBE system. By checking the box labeled InP 610, the main calibration set up screen 600 is modified as shown in FIG. 6. In this example, a new parameter labeled InGaAs GR becomes available that allows setting of the growth rate on InP for InGaAs. The equivalent growth rates of GaAs, AlAs, and InAs on GaAs in this example are automatically calculated as well as the growth rate of AlInAs on InP.

Figure 7:
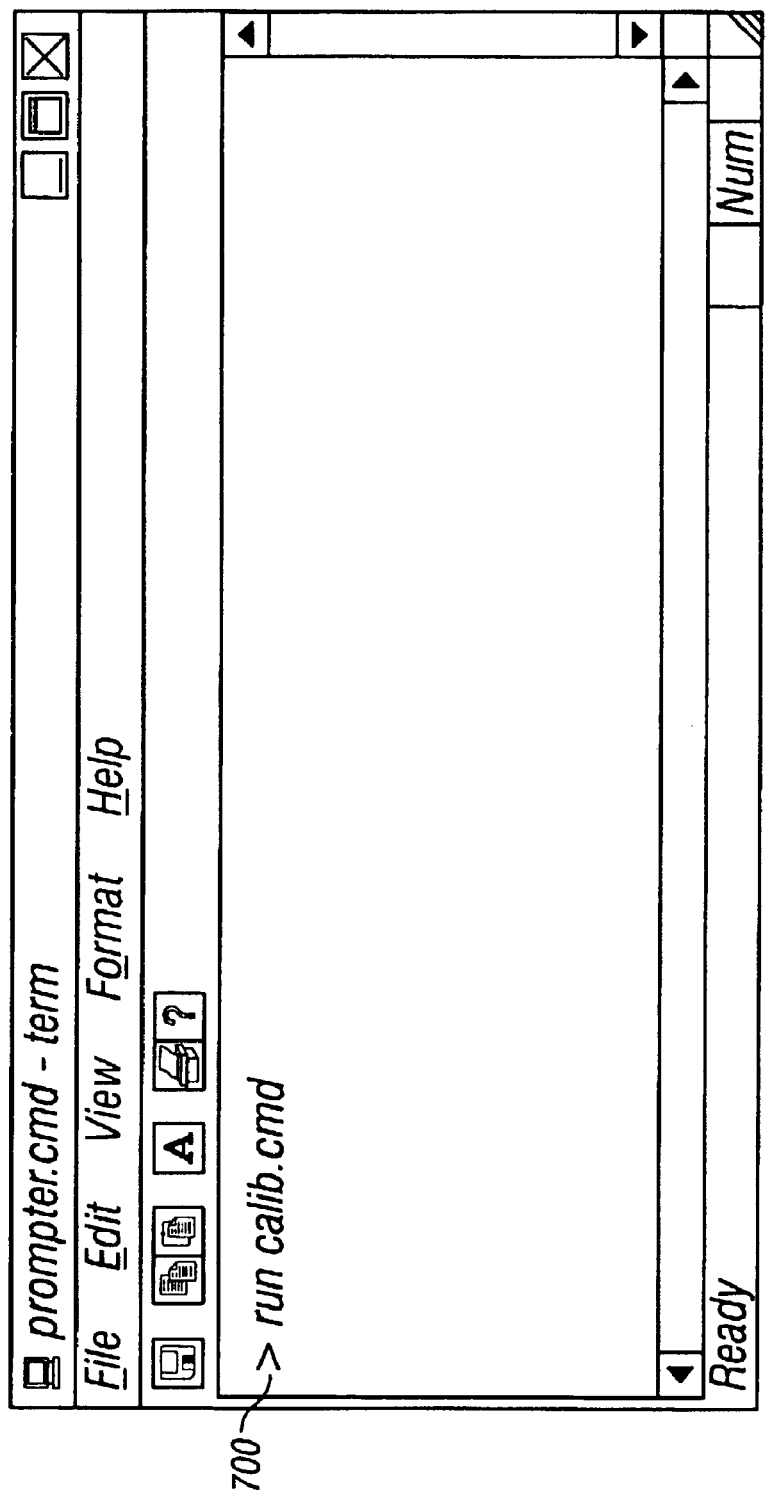
FIG. 7 is illustrative of a terminal window for initiation of a command file.

As previously noted, beam fluxes are produced in response to user initiation of a command file of the MBE system. The command file that executes the entire ramp and calibration sequence is created as a template file in which references to materials are dummy values (mat1, mat2 . . . mat8). When the operator clicks on the button "Prep for Start" 134 (FIG. 1 or FIG. 6) the template file is read by the program and a global search and replace is done for each of the materials. Thus, a template file is read in response to user actuation on a calibration setup screen at the system interface and a search and replace for the inputted growth criteria is conducted. The file is then saved in this example as calib.cmd. 700 as seen in FIG. 7. The command file is preferably given the standard name calib.cmd. 700 Once created, the command file may selectively be started by the operator by entering the name in a terminal window as shown in FIG. 7. After this no other operator action is required.

After reading the foregoing specification, one of ordinary skill will be able to effect various changes, substitutions of equivalents and various other aspects of the present invention as broadly disclosed herein. It is therefore intended that the protection granted hereon be limited only by the definition contained in the appended claims and equivalents thereof.

Having thus shown the described what is at present considered to be the preferred embodiment of the present invention, it should be noted that the same has been made by way of illustration and not limitation. Accordingly, all modifications, alterations and changes coming within the spirit and scope of the present invention are herein meant to be included.

What is claimed is:

1. A method of operating a molecular beam epitaxy (MBE) system comprising the steps of:
   inputting growth criteria into an interface of the MBE system; and
   automatically allowing the MBE system to produce beam fluxes in response to the inputted growth criteria.

2. The method of claim 1, in which the step of automatically allowing further comprises the step of producing beam fluxes in response to user initiation of a command file associated with the MBE system.

3. The method of claim 2, further comprising the steps of:
   inputting selected elements in the MBE system; and
   inputting selected growth rates and doping levels associated with the selected elements into the MBE system.

4. The method of claim 3, further comprising the steps of:
   selecting a compound to be grown;
   selecting a master material; and
   calculating mole fractions in relation to the master material to determine the growth of the compound.

5. The method of claim 1, further comprising the step of:
   inputting information into a set-up screen associated with the interface to allow calculation of a set-up point and target fluxes.

6. The method of claim 5, further comprising the step of:
   inputting into the interface at least one of the following: (a) an order in which flux calibrations are to take place; (b) a name of at least one element to be used; (c) a group number from which an element to be used originates; (d) information on whether an element to be use is to be included in the formation of compounds; (e) a mole fraction of an element; (f) a growth rate or doping level; (g) a beam flux level for an element used; and (h) cell temperature.

7. The method of claim 1, further comprising the step of:
   automatically translating the inputted growth criteria into a script executed at the MBE system.

8. The method of claim 7, further comprising the step of:
   performing a vacuum integrity check before temperature ramps are started.

9. The method of claim 8, further comprising the step of:
   inputting information into a set-up screen associated with the interface to allow for calibration of temperature cells prior to the operation of the MBE.

10. The method of claim 9, in which the inputted information relates to at least one of the following: (a) an order in which flux calibrations are to take place; (b) a name of at least one element to be used; c) a warm up temperature for each of elements selected; (d) a temperature range allowed for the MBE system; (e) an indication that flux calibration is to be done on a temperature cell; (f) flux targets; (g) a proposed accuracy of the flux calibration; (h) a time needed to ramp from an idling temperature to a selected set-point; (i) a temperature in which temperatures are to be outgassed; j) a length of time the system will be held at an outgassed temperature; (k) a length of time for cells to be calibrated; and (l) a length of time cells to stabilize.

11. The method of claim 1, further comprising the step of:
   automatically creating the command file in response to user activation of a command file identifier at the interface.

12. The method of claim 1, further comprising the step of:
   performing iterative flux measurements and temperature adjustments until a predetermined accuracy is achieved.

13. The method of claim 12, further comprising the step of:
   identifying a change in relationship between flux rate and the growth rate during operation of the MBE system.

14. The method of claim 13, further comprising the step of:
   obtaining desired growth levels in response selected growth levels in response to the change in relationship between the flux rate and the growth rate.

15. The method of claim 14, further comprising the step of:

inputting information into an absolute calibration screen associated with the interface in which the information relates to at least one of the following: (a) a name of at least one element being used; (b) an absolute growth rate of the element being used; (c) a flux associated with the element; and (d) cell temperature.

16. The method of claim 14, further comprising the step of:

performing in-situ calibration through observation of intensity from reflection high-energy electron diffraction (RHEED) oscillations selectable through the interface.

17. The method of claim 16, further comprising the step of:

inputting into the interface at least one or more of the following: (a) elements selected; (b) substrate; (c) frequency of oscillations; and (d) growth rate.

18. The method of claim 1, further comprising the step of:

calculating growth rates based on different identified substrates, selectable through the interface.

19. The method of claim 1, further comprising the step of:

reading a template in response to user actuation at the interface and conducting a search and replace for the inputted growth criteria.

20. An improved molecular beam epitaxy (MBE) system comprising:

an interface associated with the MBE system adapted to receive inputted growth criteria; and a processing component associated with the MBE system which allows beam fluxes to be produced in response to the inputted growth criteria.

21. The system of claim 20 in which the processing component is adapted to perform calculations of mole fractions in relation to input of a selected compound and input of a selected master material.

22. The system of claim 21 in which the processing component is adapted for calculation of set-up point and target fluxes.

23. The system of claim 22 further comprising a script executable at the MBE system in which the processing component automatically translates the inputted growth criteria into said script.

24. The system of claim 23 in which the processing component is adapted to calculate a calibration temperature cells prior to operation of the MBE system in response to inputted information relating to at least one of the following: (a) an order in which flux calibrations arc to take place; (b) a name of at least one element to be used; (c) a warm up temperature for each of elements selected; (d) a temperature range allowed for the MBE system; (e) an indication that flux calibration is to be done on a temperature cell; (f) flux targets; (g) a proposed accuracy of the flux calibration; (h) a time needed to ramp from an idling temperature to a selected set-point; (i) a temperature in which temperatures are to be outgassed; (j) a length of time the system will be held at an outgassed temperature; (k) a length of time for cells to be calibrated; and (l) a length of time cells to stabilize.

25. The system of claim 23 in which the interface provides prompts to allow input of selected elements and input of selected growth rates and doping levels associated with the selected elements into the MBE system.

26. The system of claim 25 in which the interface provides prompts to allow input of information relating to calibration of temperature cells prior to operation of the MBE system.

27. The system of claim 23 further comprising a command file associated with the MBE system containing inputted information relating to the operation of the MBE system.

28. The system of claim 27 in which the command file is created in response to user activation of a command file identifier at the interface.

* * * * *